(12) United States Patent
Wong

(10) Patent No.: US 12,451,891 B2
(45) Date of Patent: Oct. 21, 2025

(54) SWITCHING FREQUENCY SYNCHRONIZATION CIRCUIT, METHOD THEREFOR AND SWITCHING POWER SUPPLY

(71) Applicant: Joulwatt Technology Co., Ltd., Hangzhou (CN)

(72) Inventor: Pitleong Wong, Hangzhou (CN)

(73) Assignee: Joulwatt Technology Co., Ltd., Hangzhou (CN)

( * ) Notice: Subject to any disclaimer, the term of this patent is extended or adjusted under 35 U.S.C. 154(b) by 29 days.

(21) Appl. No.: 18/602,980

(22) Filed: Mar. 12, 2024

(65) Prior Publication Data
US 2024/0313783 A1  Sep. 19, 2024

(30) Foreign Application Priority Data
Mar. 17, 2023 (CN) .......................... 202310277414.8

(51) Int. Cl.
*H03L 7/00* (2006.01)
*H02M 3/07* (2006.01)
*H03K 5/22* (2006.01)

(52) U.S. Cl.
CPC ................ *H03L 7/00* (2013.01); *H02M 3/07* (2013.01); *H03K 5/22* (2013.01)

(58) Field of Classification Search
CPC ............... H02M 3/07; H03K 5/22; H03L 7/00
USPC .................................................. 327/141, 144
See application file for complete search history.

(56) References Cited

U.S. PATENT DOCUMENTS

2023/0046982 A1*  2/2023  Murakami .......... H02M 1/0009

FOREIGN PATENT DOCUMENTS

CN    107276587 B    4/2020

OTHER PUBLICATIONS

TW 113109781 first office action dated Dec. 4, 2024.

* cited by examiner

*Primary Examiner* — William Hernandez
(74) *Attorney, Agent, or Firm* — IPro, PLLC

(57) ABSTRACT

The present application discloses a switching frequency synchronization circuit, a method therefor and a switching power supply. By comparing peak values of a second charging voltage signal which represents an internal clock signal and a first charging voltage signal which represents an external clock signal, it is determined whether the frequency of the external clock signal meets the requirement for frequency synchronization. In a case that the frequency meets the requirement, the second charging voltage signal is reset by the external clock signal to synchronize the frequency of the internal clock signal with the frequency of the external clock signal. The present disclosure does not need a complex phase-locked loop circuit, and adjust an internal clock frequency by simple voltage comparison and synchronization mode. The control circuit is simplified and the overall system cost is reduced.

22 Claims, 6 Drawing Sheets

SWITCHING FREQUENCY SYNCHRONIZATION CIRCUIT, METHOD THEREFOR AND SWITCHING POWER SUPPLY

CROSS-REFERENCE TO RELATED APPLICATIONS

The present disclosure claims priority to a Chinese patent application No. 202310277414.8, filed on Mar. 17, 2023, and entitled "SWITCHING FREQUENCY SYNCHRONIZATION CIRCUIT, METHOD THEREFOR AND SWITCHING POWER SUPPLY", the entire contents of which are incorporated herein by reference, including the specification, claims, drawings and abstract.

TECHNICAL FIELD

The present disclosure relates to the technical field of power electronics, and more particularly, to a switching frequency synchronization circuit, a method therefor and a switching power supply.

BACKGROUND

In switching power supply devices, a clock signal is usually used to control a switching frequency or an operation frequency. The clock signal can be generated by an oscillator circuit (OSC) inside a chip. In the operation process of switching power supply devices, it is often necessary to adjust the operation frequency of switches. A conventional practice is to use an external clock signal to synchronize the clock signal inside the chip. When synchronizing with the external clock, it is necessary to determine whether the frequency of the external clock meets the requirement of synchronization frequency at first. After determining that the frequency of the external clock signal meets the requirement, the external clock is fed to the internal oscillator circuit to align the frequency of the clock signal output from the internal oscillator with the frequency of the external clock, so as to achieve the purpose of clock synchronization.

The clock synchronization in a conventional approach usually is achieved by using a relatively complex phase-locked loop circuit 100. As shown in FIG. 1, CLK_REF is an external reference clock, CLK_OUT is an output clock of an internal oscillator. The phase-locked loop circuit 100 includes a phase detector 101, a filter 102, a voltage-controlled oscillator 103, and the like, which means a complex circuit structure, a complex control scheme and a long time period for stability of the system frequency. It increases the design difficulty and cost of the whole system. Therefore, it is necessary to provide an improved technical solution to overcome the above technical problems in a conventional approach.

SUMMARY

In view of this, one object of the present disclosure is to provide a switching frequency synchronization circuit, a method therefor and a switching power supply, to solve the problem of a complex switching frequency synchronization scheme in a conventional approach.

According to one aspect of the present disclosure, there is provided a switching frequency synchronization circuit, comprising: a first voltage generating circuit configured to obtain a first charging voltage signal according to an external clock signal, a first oscillator configured to provide an internal clock signal for controlling a switching frequency and to generate a second charging voltage signal representing the internal clock signal, a comparison unit configured to compare peak values of the first charging voltage signal and the second charging voltage signal to determine whether the frequency of the external clock signal meets the requirement of a frequency range, so that the second charging voltage signal is reset by the external clock signal in a case that the requirement is met, to synchronize the frequency of the internal clock signal output from the first oscillator with the frequency of the external clock signal.

Optionally, the frequency of the external clock signal is determined to meet the requirement of the frequency range when the peak value of the first charging voltage signal is within a range between −50% and +50% of the peak value of the second charging voltage signal.

Optionally, the first charging voltage signal and the second charging voltage signal are both sawtooth signals, the comparison unit determines whether a time difference between a falling edge of the first charging voltage signal and a falling edge of the second charging voltage signal is within a predetermined time threshold range, and if so, the second charging voltage signal is reset by the external clock signal.

Optionally, the switching frequency synchronization circuit comprises a switching control circuit which provides a switching control signal for controlling on and off states of a first switching transistor in the first oscillator, the switching control circuit selects the internal clock signal or the external clock signal according to a comparison result of the comparison unit, to generate the switching control signal which turns on the first switching transistor to reset the second charging voltage signal.

Optionally, the first oscillator comprises a first charging capacitor, a first switching transistor in parallel with the first charging capacitor, and a first comparator, the first charging capacitor is charged by a first current source to obtain the second charging voltage signal across the first charging capacitor; the first switching transistor resets the second charging voltage signal in accordance with the switching control signal; the first comparator compares the second charging voltage signal and a first reference voltage to obtain the internal clock signal.

Optionally, the first voltage generating circuit comprises a second charging capacitor and a second switching transistor, and the second charging capacitor is charged by a second current source to obtain the first charging voltage signal across the second charging capacitor, the second switching transistor resets the first charging voltage signal in accordance with the external clock signal.

Optionally, the comparison unit comprises a first comparison circuit, the first comparison circuit obtains the peak values of the second charging voltage signal and the first charging voltage signal, and compares the peak values of the second charging voltage signal and the first charging voltage signal to generate a first comparison result, which is a comparison result of the comparison unit to determine whether the frequency of the external clock signal meets the requirement of the frequency range.

Optionally, the comparison unit comprises a first comparison circuit and a second comparison circuit, the first comparison circuit obtains the peak values of the second charging voltage signal and the first charging voltage signal, and compares the peak values of the second charging voltage signal and the first charging voltage signal to generate a first comparison result; the second comparison circuit obtains falling edges of the second charging voltage signal and the first charging voltage signal, and compares a time difference between the falling edges of the second charging voltage signal and the first charging voltage signal with a predetermined time difference to generate a second comparison result; a logic operation is performed on the first comparison result and the second comparison result, and a logic operation result is used as a comparison result of the comparison unit.

Optionally, the first comparison circuit comprises an upper and lower limit circuit, a second comparator, a third comparator and a logic circuit. The upper and lower limit circuit receives the peak value of the second charging voltage signal and obtains an upper voltage limit and a lower voltage limit accordingly. The second comparator compares the peak value of the first charging voltage signal and the upper voltage limit to obtain a first comparison signal. The third comparator compares the peak value of the first charging voltage signal and the lower voltage limit to obtain a second comparison signal. The logic circuit receives the first comparison signal and the second comparison signal and generates the first comparison result after a logic operation.

Optionally, the first comparison circuit comprises a second comparator, a third comparator and a logic circuit, the first voltage generating circuit outputs a first peak value and a second peak value of the first charging voltage signal, wherein the first peak value and the second peak value are different from each other; the second comparator compares the peak value of the second charging voltage signal and the first peak value to obtain a first comparison signal, the third comparator compares the peak value of the second charging voltage signal and the second peak value to obtain a second comparison signal, the logic circuit receives the first comparison signal and the second comparison signal and generates the first comparison result after a logic operation.

Optionally, the switching control circuit comprises a selection circuit, the selection circuit receives the internal clock signal, the external clock signal and a comparison result of the comparison unit; in a case that the comparison result indicates that the frequency of the external clock signal meets the requirement, the external clock signal is selected and output as the switching control signal; in a case that the comparison result indicates that the frequency of the external clock signal does not meet the requirement, the internal clock signal is selected and output as the switching control signal.

Optionally, at least some circuit structures of the first oscillator, the first voltage generating circuit, the comparison unit, and the switching control circuit are integrated in one or more chips.

Optionally, the comparison unit comprises a sample-and-hold circuit, the sample-and-hold circuit receives the first charging voltage signal and the second charging voltage signal to obtain peak values of the first charging voltage signal and the second charging voltage signal.

According to a second aspect of the present disclosure, there is provided a method for synchronizing a switching frequency, comprising: obtaining a first charging voltage signal in accordance with an external clock signal, obtaining a second charging voltage signal in accordance with an internal clock signal from a first oscillator for controlling a switching frequency; obtaining and comparing peak values of the first charging voltage signal and the second charging voltage signal to determine whether the frequency of the external clock signal meets the requirement of a frequency range, so that the second charging voltage signal is reset by the external clock signal in a case that the requirement is met, to synchronize the frequency of the internal clock signal with the frequency of the external clock signal.

Optionally, the frequency of the external clock signal is determined to meet the requirement of the frequency range when the peak value of the first charging voltage signal is within a range between −50% and +50% of the peak value of the second charging voltage signal.

Optionally, the first charging voltage signal and the second charging voltage signal are both sawtooth signals, the method determines whether a time difference between a falling edge of the first charging voltage signal and a falling edge of the second charging voltage signal is within a predetermined time threshold range, and if so, the second charging voltage signal is reset by the external clock signal.

Optionally, the method obtains the peak values of the second charging voltage signal and the first charging voltage signal, and compares the peak values of the second charging voltage signal and the first charging voltage signal to generate a first comparison result; the method obtains falling edges of the second charging voltage signal and the first charging voltage signal, and compares a time difference between the falling edges of the second charging voltage signal and the first charging voltage signal with a predetermined time difference to generate a second comparison result; in a case that both of the first comparison result and the second comparison result are valid, the second charging voltage signal is reset by the external clock signal.

According to a third aspect of the present disclosure, there is provided a switching power supply comprising a power stage circuit and a control circuit, wherein the control circuit comprises the switching frequency synchronization circuit as mentioned above, and a switching control driving circuit, the switching frequency synchronization circuit is used for synchronizing a switching frequency of a switching transistor in the power stage circuit; the switching control driving circuit is electrically coupled with the switching frequency synchronization circuit, and is used for controlling on and off states of the switching transistor in the power stage circuit according to the internal clock signal output from the switching frequency synchronization circuit.

Optionally, the control circuit comprises a ramp compensation circuit, the ramp compensation circuit receives the second charging voltage signal to obtain a ramp signal associated with a peak value of the second charging voltage signal; the switching control driving circuit is electrically coupled with the ramp compensation circuit to control on and off states of the switching transistor in the power stage circuit according to the ramp signal.

Optionally, the ramp compensation circuit comprises a ramp generating circuit and a first current circuit, the ramp generating circuit obtains a first ramp signal according to a first current source; the first current circuit receives a peak signal of the second charging voltage signal to obtain a first current signal associated with the peak signal of the second charging voltage signal, which flow through a resistor to generate a second voltage signal; the first ramp signal is superimposed with the second voltage signal to obtain the ramp signal.

Optionally, the switching power supply comprises a multi-phase power stage circuit, the control circuit comprises a frequency multiplier which obtains a third charging voltage signal according to a charging source and a charging capacitor, and obtains frequency-multiplied signals by comparing the third charging voltage signal and a second reference signal, wherein the frequency multiplier receives the second charging voltage signal, and adjusts a value of the second reference signal according to a falling edge of the second charging voltage signal and a falling edge of the last one of the frequency-multiplied signals.

Optionally, the frequency multiplier controls the falling edge of the last one of the frequency-multiplied signals to coincide with the falling edge of the second charging voltage signal.

In the switching frequency synchronization circuit according to the present disclosure, by comparing peak values of a second charging voltage signal which represents an internal clock signal and a first charging voltage signal which represents an external clock signal, it is determined whether the frequency of the external clock signal meets the requirement for frequency synchronization. In a case that the frequency meets the requirement, the second charging voltage signal is reset by the external clock signal to synchronize the frequency of the internal clock signal with the frequency of the external clock signal. The present disclosure does not need a phase-locked loop circuit, and adjust an internal clock frequency by simple voltage comparison and synchronization mode. The control circuit is simplified and the overall system cost is reduced.

DETAILED DESCRIPTION

The following preferred embodiments of the present disclosure are described in detail in conjunction with attached drawings, but the disclosure is not limited to these embodiments. The present disclosure covers any method and scheme that may be substitutions, modifications, equivalents within the spirit and scope of the present disclosure.

In order to enable the public to have a thorough understanding of the present disclosure, specific details are described in detail in the following preferred embodiment of the present disclosure, even in a case that the present disclosure can be fully understood by those skilled in the art without the description of these details.

The present disclosure is described more specifically by way of example hereinafter with reference to the accompanying drawings. It should be noted that the accompanying drawings are simplified and not drawn to precise scale, and are only used to facilitate and clearly assist the purpose of illustrating the embodiments of the present disclosure.

Figure 1:
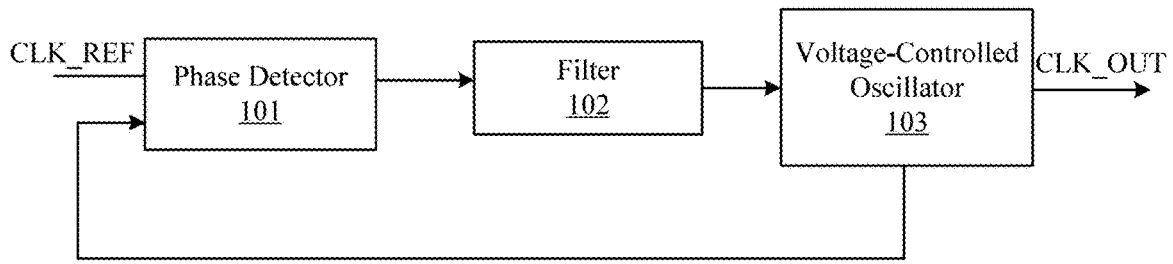
FIG. 1 is a block diagram of a conventional frequency synchronization circuit.
Figure 2:
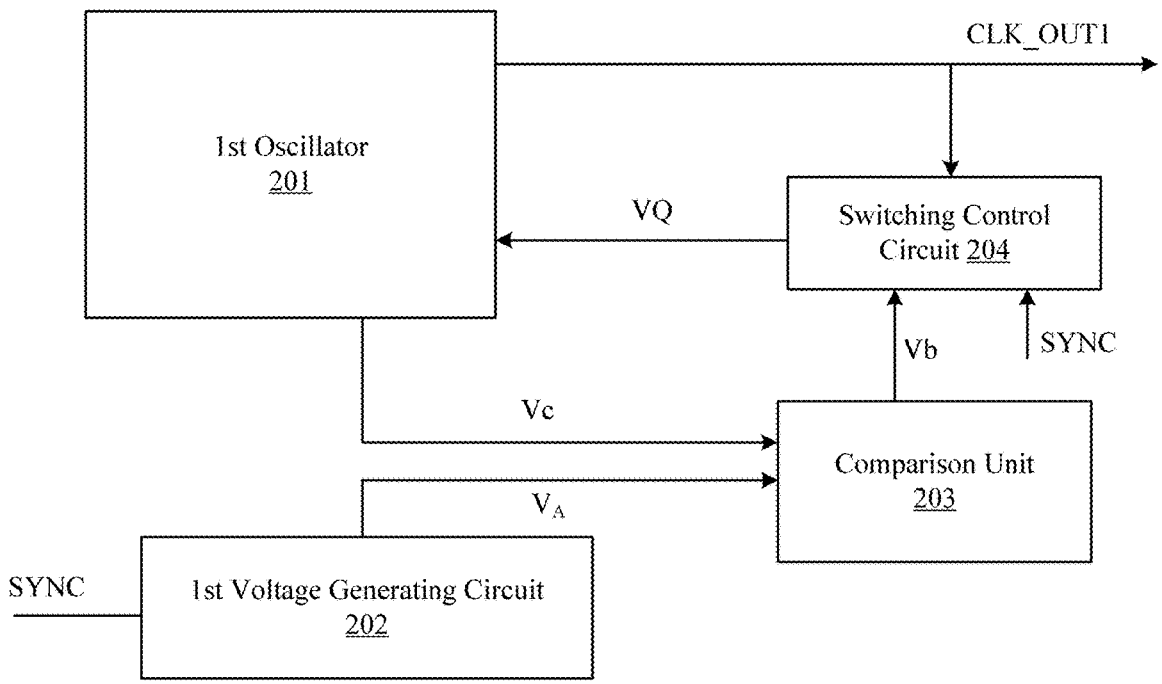
FIG. 2 is a block diagram of a switching frequency synchronization circuit according to the present disclosure.
Figure 3:
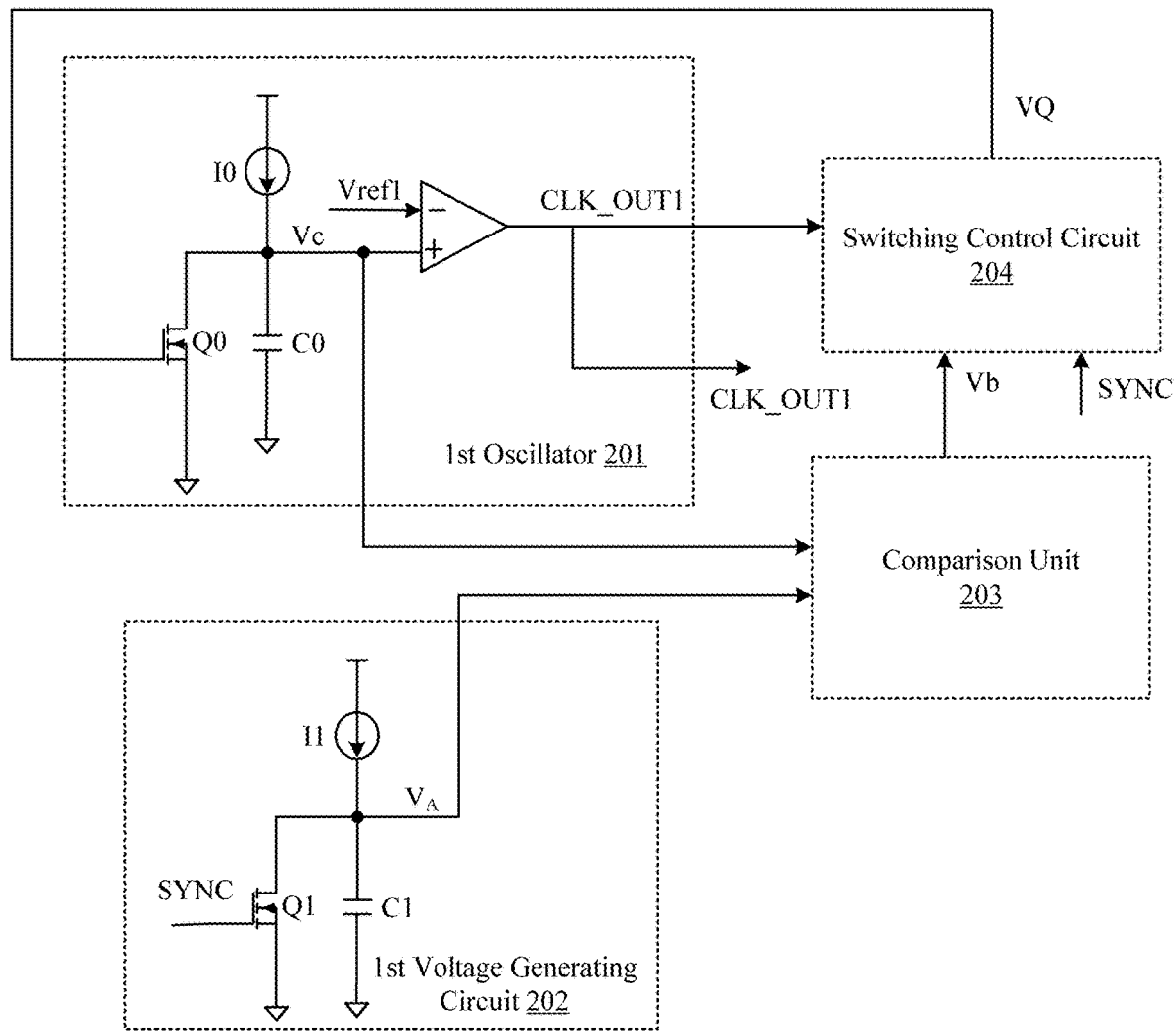
FIG. 3 is a detailed circuit diagram of FIG. 2 according to the present disclosure.

FIG. 2 is a block diagram of a switching frequency synchronization circuit 200 according to the present disclosure, FIG. 3 is a detailed circuit diagram of FIG. 2 according to the present disclosure. As shown in FIG. 2, the switching frequency synchronization circuit 200 according to the embodiment of the present disclosure includes a first oscillator 201 which provides an internal clock signal CLK_OUT1 for controlling the switching frequency, and generates a second charging voltage signal Vc which represents the internal clock signal. A first voltage generating circuit 202 obtains a first charging voltage signal VA according to an external clock signal SYNC. A comparison unit 203 compares peak values of the first charging voltage signal VA and the second charging voltage signal Vc to determine whether the frequency of the external clock signal meets the requirement of a frequency range, so that the second charging voltage signal Vc is reset by the external clock signal in a case that the requirement is met, to synchronize the frequency of the internal clock signal from the first oscillator 201 with the frequency of the external clock signal.

Specifically, as shown in FIG. 3, the first oscillator 201 comprises a first charging capacitor C0, a first switching transistor Q0 in parallel with the first charging capacitor, and a first comparator, the first charging capacitor is charged by a first current source I0 to obtain the second charging voltage signal Vc across the first charging capacitor; the first switching transistor resets the second charging voltage signal Vc in accordance with the switching control signal VQ; the first comparator compares the second charging voltage signal Vc and a first reference voltage Vref1 to obtain the internal clock signal CLK_OUT1. The first voltage generating circuit 202 comprises a second charging capacitor C1 and a second switching transistor Q1, and the second charging capacitor C1 is charged by a second current source I1 to obtain the first charging voltage signal VA across the second charging capacitor, the second switching transistor resets the first charging voltage signal in accordance with the external clock signal. It can be seen from the above circuit structure that the first charging voltage signal and the second charging voltage signal are both sawtooth wave signals. When the peak value is reached, the first charging voltage signal and the second charging voltage signal are reset by the external clock signal and the internal clock signal, respectively, so that the peak value of the first charging voltage signal can represent the frequency information of the external clock signal, and the peak value of the second charging voltage signal can represent the frequency information of the internal clock signal.

Optionally, in some embodiments of the present disclosure, the frequency of the external clock signal is determined to meet the requirement of the frequency range when the peak value of the first charging voltage signal is within a range between −50% and +50% of the peak value of the second charging voltage signal. It will be more preferable when the peak value of the first charging voltage signal is within a range between −20% and +20% of the peak value of the second charging voltage signal. Here, the peak value of the first charging voltage signal represents the frequency information of the external clock signal, and the peak value of the second charging voltage signal represents the frequency information of the internal clock signal. That is, in a case that the frequency of the external clock signal is within a range between −50% and +50% of the frequency of the internal clock signal, it is determined that the frequency of the external clock signal meets the requirement of the frequency range. In this way, the switching frequency has been synchronized and will not change too much, which will otherwise causes sudden change of the operation state of the system.

Figure 4:
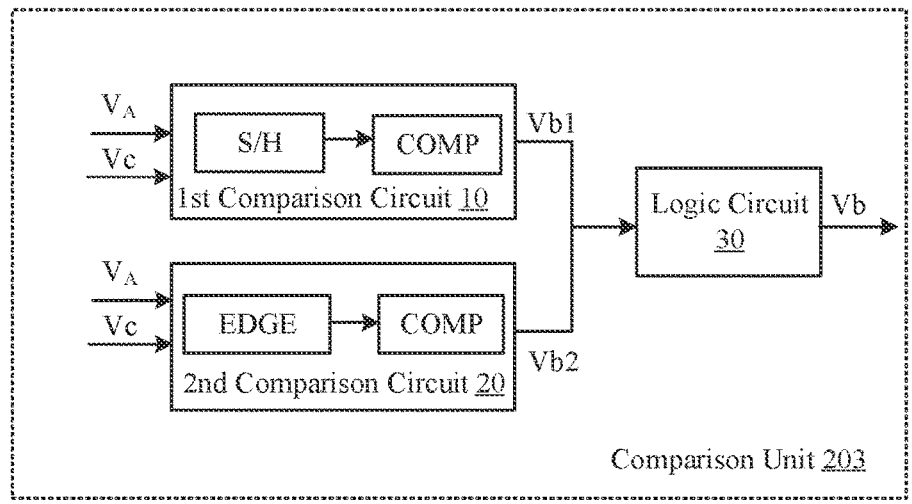
FIG. 4 is a circuit diagram of a first example of a comparison unit in FIG. 2 according to the present disclosure.

Furthermore, FIG. 4 is a circuit diagram of a first example of a comparison unit 203 in FIG. 2 according to the present disclosure. The comparison unit 203 comprises a first comparison circuit 10, the first comparison circuit 10 obtains the peak values of the second charging voltage signal Vc and the first charging voltage signal VA, and compares the peak values of the second charging voltage signal and the first charging voltage signal to generate a comparison result Vb, which is used to determine whether the frequency of the external clock signal meets the requirement of the frequency range. For example, in a case that the comparison result is in a valid state at a high level, the frequency of the external clock signal is indicated to be within the frequency range, and in a case that the comparison result is in an invalid state at a low level, the frequency of the external clock signal is indicated to be not within the frequency range. Here, the comparison unit 203 may also include a sample-and-hold circuit that receives the first charging voltage signal and the second charging voltage signal to obtain peak values of the first charging voltage signal and the second charging voltage signal. The sample-and-hold circuit may be implemented by a circuit structure consisting of a switch and a capacitor.

Figure 5A:
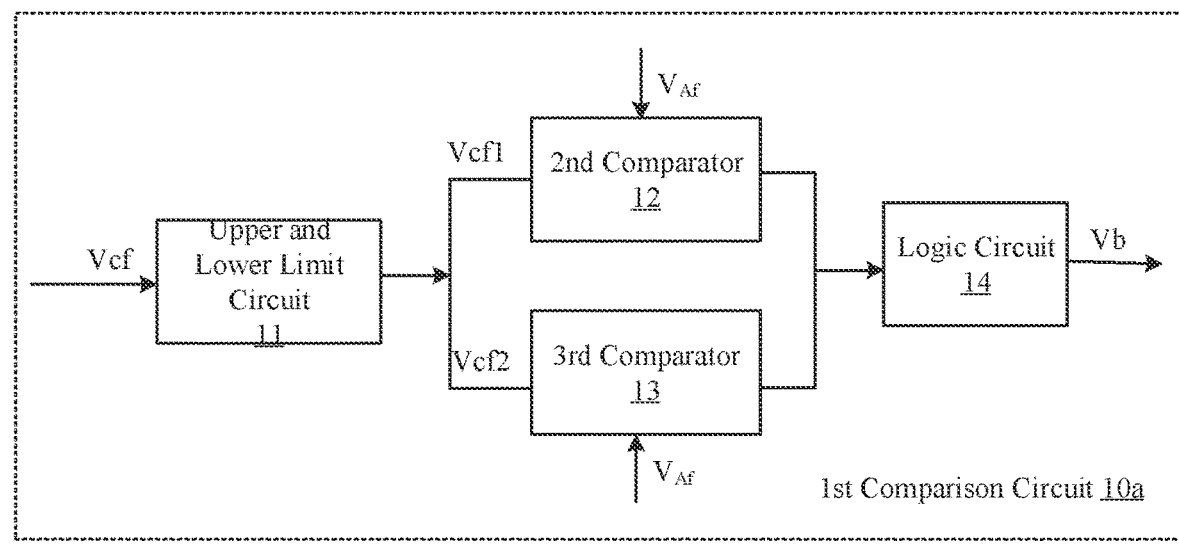
FIG. 5a is a circuit diagram of a first example of a comparison circuit in FIG. 2 according to the present disclosure.

In a first example of the first comparison circuit 10a shown in FIG. 5a, the first comparison circuit 10a comprises an upper and lower limit circuit 11, a second comparator 12, a third comparator 13 and a logic circuit 14. The upper and lower limit circuit 11 receives a peak value Vcf of the second charging voltage signal and obtains an upper voltage limit Vcf1 and a lower voltage limit Vcf2 accordingly. The second comparator 12 compares the peak value $V_{Af}$ of the first charging voltage signal and the upper voltage limit Vcf1 to obtain a first comparison signal. The third comparator 13 compares the peak value $V_{Af}$ of the first charging voltage signal and the lower voltage limit Vcf2 to obtain a second comparison signal. The logic circuit 14 receives the first comparison signal and the second comparison signal and generates the comparison result Vb after a logic operation. Here, the logic operation can be performed by a transmission gate, such as an AND gate, or an OR gate, or the like. The upper voltage limit Vcf1 and the lower voltage limit Vcf2 can be set to be +50% and −50% of the peak value Vcf of the second charging voltage signal, respectively. Thereby, it meets the requirement for determining whether the first charging voltage signal is within the range between −50% and +50% of the second charging voltage.

Figure 5B:
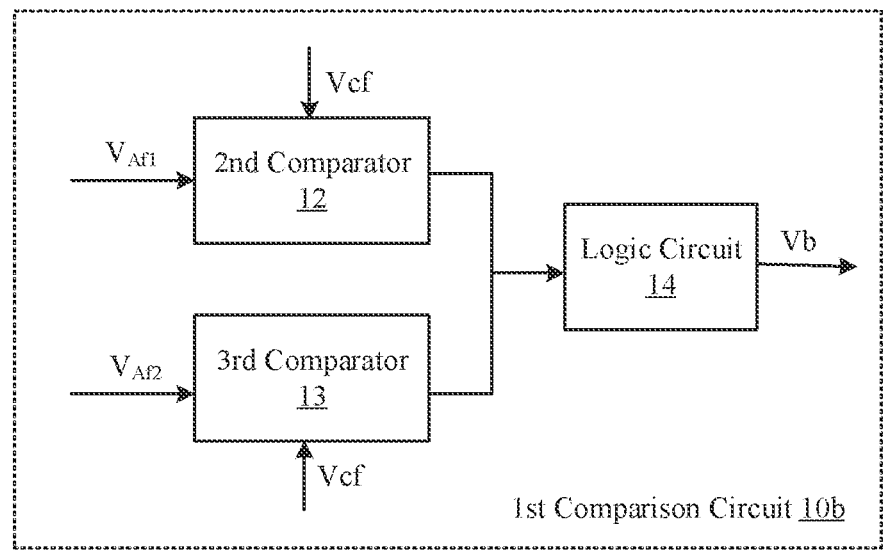
FIG. 5b is a circuit diagram of a second example of a comparison circuit in FIG. 2 according to the present disclosure.

In a second example of the first comparison circuit 10b shown in FIG. 5b, the first comparison circuit 10b comprises a second comparator 12, a third comparator 13 and a logic circuit 14. The first voltage generating circuit outputs a first peak value $V_{Af1}$ and a second peak value $V_{Af2}$ of the first charging voltage signal, wherein the first peak value and the second peak value different from each other. For example, the first current source and the second current source may be adjusted to obtain the expected first and second peak values. The second comparator 12 compares the peak value Vcf of the second charging voltage signal and the first peak value $V_{Af1}$ to obtain a first comparison signal. The third comparator 13 compares the peak value Vcf of the second charging voltage signal Vc and the second peak value $V_{Af2}$ to obtain a second comparison signal. The logic circuit 14 receives the first comparison signal and the second comparison signal and generates the first comparison result after a logic operation. The first comparison result is output from the comparison unit 203 as a comparison result Vb. Similarly, in this example, the logic operation can be performed by a transmission gate, such as an AND gate, or an OR gate, or the like. The first peak value $V_{Af1}$ and the second peak value $V_{Af2}$ can be set to be 2 times of and ⅔ of the peak value $V_{Af}$ of the first charging voltage signal VA, respectively. Thereby, it meets the requirement for determining whether the first charging voltage signal is within the range between −50% and +50% of the second charging voltage.

In another embodiment, the comparison unit 203 also includes a second comparison circuit 20, while the first comparison circuit 10 may have the same function and configuration as mentioned in the above-described embodiments. The second comparison circuit 20 obtains falling edges of the second charging voltage signal and the first charging voltage signal, and compares a time difference between the falling. The second comparison circuit 20 obtains falling edges of the second charging voltage signal and the first charging voltage signal, and compares a time difference between the falling edges of the second charging voltage signal and the first charging voltage signal with a predetermined time difference to generate a second comparison result. After a logic operation of the first comparison result and the second comparison result, a comparison result Vb is output from the comparison unit 203. In some cases that phase synchronization is required, it is necessary to synchronize the phase as well while the frequency is synchronized. The second comparison circuit 20 can achieve accurate phase synchronization. The smaller the time difference between the falling edge of the second charging voltage signal and the falling edge of the first charging voltage signal, the better the effect to be achieved. The predetermined time difference is zero or close to zero. Thus, the switching cycles can be adjusted by the second comparison circuit 20 to be not too long or too short in the switching frequency adjustment process.

Figure 6:
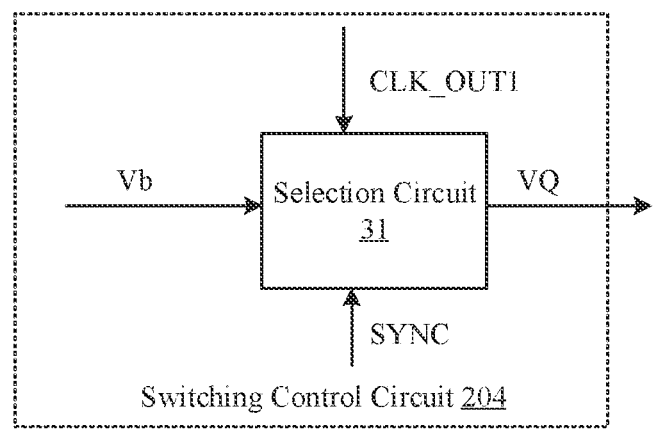
FIG. 6 is a circuit diagram of a switching control circuit in FIG. 2 according to the present disclosure.

Specifically, referring to FIG. 6, a switching control circuit 204 provides a switching control signal VQ for controlling on and off states of a first switching transistor Q0 in the first oscillator 201. The switching control circuit 204 selects the internal clock signal or the external clock signal according to a comparison result Vb of the comparison unit 203, to generate the switching control signal which turns on the first switching transistor to reset the second charging voltage signal Vc. In a case that the comparison result indicates that the frequency of the external clock signal meets the frequency requirement, such as the requirement for a range, or the requirement for a range and a phase, the second charging voltage signal Vc is reset by the external clock signal, to adjust the frequency of the internal clock signal generated by the first oscillator 201 to be consistent with the frequency of the external clock signal. In a case that the comparison result indicates that the frequency of the external clock signal does not meet the frequency requirement, the second charging voltage signal Vc is reset by the internal clock signal, and the frequency of the internal oscillator generated by the first oscillator 201 will not be adjusted.

Finally, it should be noted that the frequency comparison in the present disclosure can be determined in real time during operation. For example, in the operation process, after synchronization by the internal clock signal, the switching control circuit 204 selects the internal clock signal to reset when detecting that the requirement is not met for the frequency synchronization due to variation of the frequency of the external clock signal SYNC. Thus, it smoothly change to the frequency of the internal clock.

Figure 7:
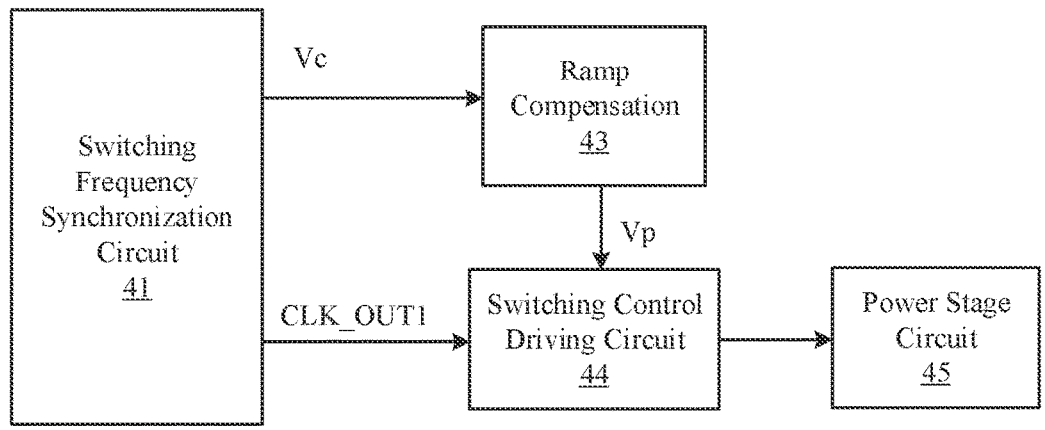
FIG. 7 is a block diagram of a switching power supply having a switching frequency synchronization circuit according to the present disclosure.

In an example, the switching frequency synchronization circuit 41 can be used in a switching power supply 40. In FIG. 7, there is shown a circuit block diagram of a switching power supply 40 having a switching frequency synchronization circuit 41 according to the present disclosure. The switching power supply 40 includes a power stage circuit 45 and a control circuit, and the control circuit includes the above-mentioned switching frequency synchronization circuit 41 and a switching control driving circuit 44. The switching frequency synchronization circuit 41 is used to synchronize the switching frequency of a switching transistor in the power stage circuit 45. The switching control driving circuit 44 is electrically coupled with the switching frequency synchronization circuit 41, and is used for controlling on and off states of the switching transistor in the power stage circuit 45 according to the internal clock signal output from the switching frequency synchronization circuit 41. Here, the switching control driving circuit 44 controls an operation frequency of a switching transistor in the power stage circuit 45 according to the frequency of the internal clock signal, generally in a fixed frequency operating mode. The operation frequency of the switch can be that of the internal clock signal.

In an example, a switching power supply 40 according to the present disclosure further includes a ramp compensation circuit that receives the second charging voltage signal Vc to obtain a ramp signal Vp associated with a peak value of the second charging voltage signal. The switching control driving circuit 44 is electrically coupled with the ramp compensation circuit to control on and off states of the switching transistor in the power stage circuit 45 according to the ramp signal. Those skilled in the art will understand that the ramp compensation generally is used for compensating for a loop current which is sampled in the switching power supply 40, such as an inductor current, to regulate the stability of the system.

Figure 8:
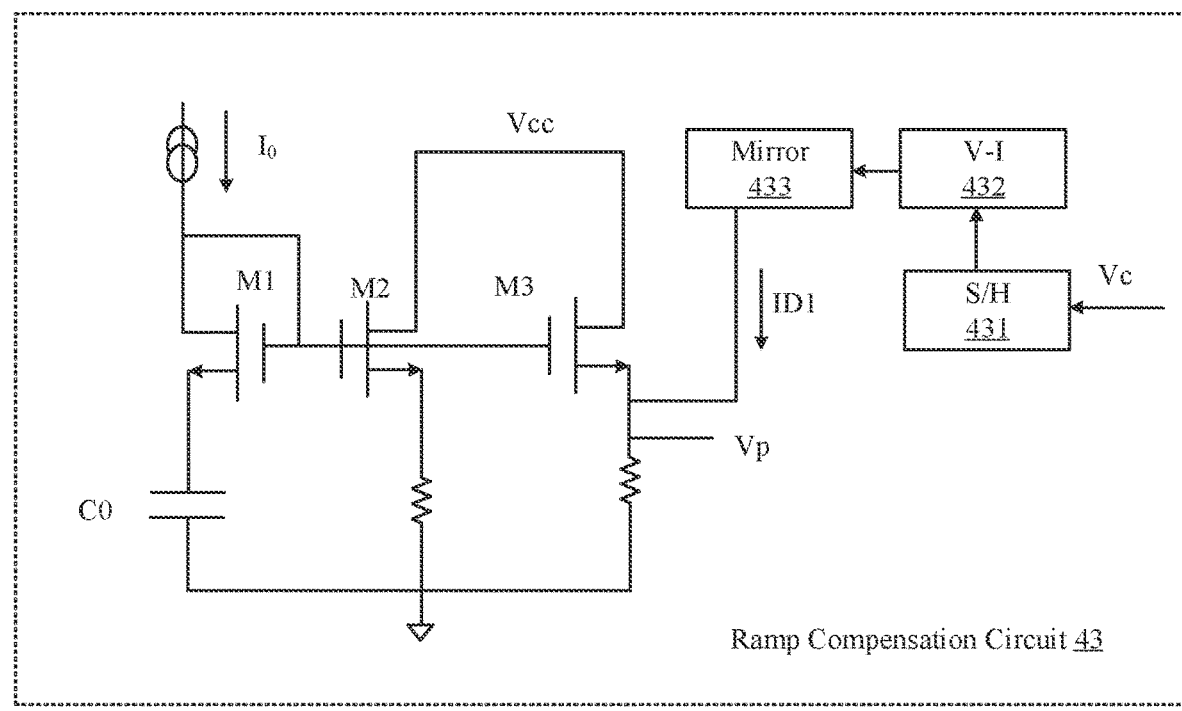
FIG. 8 is a block diagram of a ramp compensation circuit in a switching power supply in FIG. 7 according to the present disclosure.

In an example shown in FIG. 8, the ramp compensation circuit 43 comprises a ramp generating circuit and a first current circuit, the ramp generating circuit obtains a first ramp signal according to a first current source; the first current circuit receives a peak signal of the second charging voltage signal to obtain a first current signal associated with the peak signal of the second charging voltage signal Vc, which flow through a resistor to generate a second voltage signal; the first ramp signal is superimposed with the second voltage signal to obtain the ramp signal Vp. Here, a peak signal is obtained by sampling the second charging voltage signal with a sample-and-hold circuit 431. Then, a first current signal, which is proportional to the peak signal of the second charging voltage signal Vc, can be obtained by a voltage-current conversion circuit 432 and a current mirror 433. The voltage-current conversion circuit 432 and the current mirror 433 can be realized by some electronic devices such as a voltage follower and switches, which are known in the prior art. Here, the second voltage signal, which is proportional to the peak signal of the second charging voltage signal Vc, is superimposed on the first ramp signal, so that the slope of the ramp signal can be adjusted with the variation of the second charging voltage signal Vc. The ramp signal can be a staged ramp signal. After the variation of switching frequency in the switching power supply 40, the slope of the ramp signal can be change accordingly. As a result, the slope compensation will be more accurate.

Figure 9:
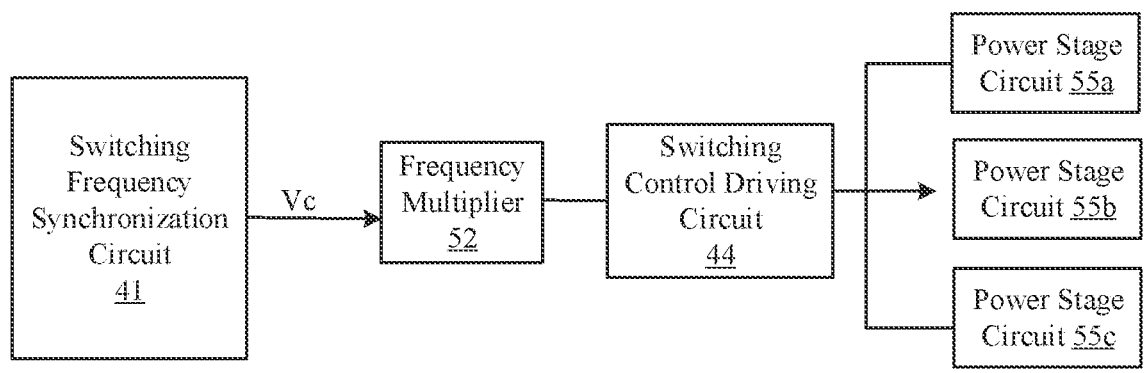
FIG. 9 is a block diagram of a multi-phase switching power supply having a switching frequency synchronization circuit according to the present disclosure.

In an example, the switching power supply may be a multi-phase switching power supply 50. FIG. 9 is a block diagram of a multi-phase switching power supply 50 having a switching frequency synchronization circuit 41 according to the present disclosure. The control circuit comprises a frequency multiplier 52 which obtains a third charging voltage signal according to a charging source and a charging capacitor, and obtains frequency-multiplied signals by comparing the third charging voltage signal and a second reference signal, wherein the frequency multiplier 52 receives the second charging voltage signal Vc, and adjusts a value of the second reference signal according to a falling edge of the second charging voltage signal and a falling edge of the last one of the frequency-multiplied signals. Optionally, the frequency multiplier 52 controls the falling edge of the last one of the frequency-multiplied signals to coincide with the falling edge of the second charging voltage signal. The frequency multiplier 52 may generate a plurality of successive sawtooth wave signals to obtain a plurality of pulse signals in a multiplied frequency relation. The plurality of pulse signals are respectively used to control phases of the plurality of power stage circuits 55a-55c so that the phases of the plurality of power stage circuits 55a-55c are evenly staggered. Here, the last one of the frequency-multiplied signals means the last one of the plurality of successive sawtooth wave signals. In the multi-phase switching power supply 50 according to the present disclosure, when the internal switching frequency is adjusted, the multi-phase clock signals may be adjusted according to the switching frequency having been adjusted, so as to obtain staggered phases in real time and following the adjusted frequency.

At least some portions of the switching frequency synchronization circuit and the control circuit in the switching power supply in all of the above embodiments may be integrated in one chip, or a plurality of chips, which has advantages of reduced cost.

In the present disclosure, voltage peaks are compared to determine whether the external clock frequency meets the requirement, taking a variable range of the external clock and the fluctuation of the operation cycles into consideration when synchronizing with the external clock. The internal clock signal and the external clock signal can have the same frequency and phase. Thus, there is no frequency jitter in the switching process.

In the present disclosure, an independent oscillator design is adopted, which makes the circuit have independent internal clock signal with a fixed frequency, and can adjust the internal frequency to synchronize with the external clock frequency when the external clock meets the requirement. Therefore, the present disclosure also makes the internal oscillator frequency smooth during the switching process, and does not have a longer cycle or a shorter cycle.

Additionally, the embodiments and the attached drawings are merely given for describing one example of implementing the present disclosure, but not to limit the specific structure of the present disclosure's implementation. Various changes or modifications can be made to these embodiments without departing from the principles and essence of the present disclosure. All of such changes and modifications fall within the scope of protection of the present disclosure.

Although the above embodiments are described and explained separately, some technical aspects are commonly shared. It can be understood by those skilled in the art that some technical aspects of the embodiments can be replaced or combined together. Even in a case that some aspects are not explicitly depicted in one embodiment, reference may be made to other embodiments.

The above-mentioned embodiments do not limit the scope of protection of the technical solution. Any modifications, equivalent substitutions, and improvements made within the spirit and principles of the embodiments mentioned above shall be included within the scope of protection of the present disclosure.

What is claimed is:

1. A switching frequency synchronization circuit, comprising:
    a first voltage generating circuit configured to obtain a first charging voltage signal according to an external clock signal,
    a first oscillator configured to provide an internal clock signal for controlling a switching frequency and to generate a second charging voltage signal representing the internal clock signal,
    a comparison unit configured to compare peak values of the first charging voltage signal and the second charging voltage signal to determine whether the frequency of the external clock signal meets the requirement of a frequency range, so that the second charging voltage signal is reset by the external clock signal in a case that the requirement is met, to synchronize the frequency of the internal clock signal from the first oscillator with the frequency of the external clock signal.

2. The switching frequency synchronization circuit according to claim 1, wherein the frequency of the external clock signal is determined to meet the requirement of the frequency range when the peak value of the first charging voltage signal is within a range between −50% and +50% of the peak value of the second charging voltage signal.

3. The switching frequency synchronization circuit according to claim 2, wherein the first charging voltage signal and the second charging voltage signal are both sawtooth signals,
    the comparison unit determines whether a time difference between a falling edge of the first charging voltage signal and a falling edge of the second charging voltage signal is within a predetermined time threshold range, and if so, the second charging voltage signal is reset by the external clock signal.

4. The switching frequency synchronization circuit according to claim 2, comprising a switching control circuit which provides a switching control signal for controlling on and off states of a first switching transistor in the first oscillator,
    the switching control circuit selects the internal clock signal or the external clock signal according to a comparison result of the comparison unit, to generate the switching control signal which turns on the first switching transistor to reset the second charging voltage signal.

5. The switching frequency synchronization circuit according to claim 4, wherein the first oscillator comprises a first charging capacitor, the first switching transistor in parallel with the first charging capacitor, and a first comparator,
    the first charging capacitor is charged by a first current source to obtain the second charging voltage signal across the first charging capacitor;
    the first switching transistor resets the second charging voltage signal in accordance with the switching control signal;
    the first comparator compares the second charging voltage signal and a first reference voltage to obtain the internal clock signal.

6. The switching frequency synchronization circuit according to claim 4, wherein the first voltage generating circuit comprises a second charging capacitor and a second switching transistor, and the second charging capacitor is charged by a second current source to obtain the first charging voltage signal across the second charging capacitor,
    the second switching transistor resets the first charging voltage signal in accordance with the external clock signal.

7. The switching frequency synchronization circuit according to claim 4, wherein the comparison unit comprises a first comparison circuit,
    the first comparison circuit obtains the peak values of the second charging voltage signal and the first charging voltage signal, and compares the peak values of the second charging voltage signal and the first charging voltage signal to generate a first comparison result, which is a comparison result of the comparison unit to determine whether the frequency of the external clock signal meets the requirement of the frequency range.

8. The switching frequency synchronization circuit according to claim 7, wherein the first comparison circuit comprises an upper and lower limit circuit, a second comparator, a third comparator and a logic circuit,
    the upper and lower limit circuit receives the peak value of the second charging voltage signal and obtains an upper voltage limit and a lower voltage limit accordingly,
    the second comparator compares the peak value of the first charging voltage signal and the upper voltage limit to obtain a first comparison signal,
    the third comparator compares the peak value of the first charging voltage signal and the lower voltage limit to obtain a second comparison signal,
    the logic circuit receives the first comparison signal and the second comparison signal and generates the first comparison result after a logic operation.

9. The switching frequency synchronization circuit according to claim 7, wherein the first comparison circuit comprises a second comparator, a third comparator and a logic circuit,
    the first voltage generating circuit outputs a first peak value and a second peak value of the first charging voltage signal, wherein the first peak value and the second peak value are different from each other;
    the second comparator compares the peak value of the second charging voltage signal and the first peak value to obtain a first comparison signal,
    the third comparator compares the peak value of the second charging voltage signal and the second peak value to obtain a second comparison signal,
    the logic circuit receives the first comparison signal and the second comparison signal and generates the first comparison result after a logic operation.

10. The switching frequency synchronization circuit according to claim 4, wherein the comparison unit comprises a first comparison circuit and a second comparison circuit,
    the first comparison circuit obtains the peak values of the second charging voltage signal and the first charging voltage signal, and compares the peak values of the second charging voltage signal and the first charging voltage signal to generate a first comparison result;

the second comparison circuit obtains falling edges of the second charging voltage signal and the first charging voltage signal, and compares a time difference between the falling edges of the second charging voltage signal and the first charging voltage signal with a predetermined time difference to generate a second comparison result;

a logic operation is performed on the first comparison result and the second comparison result, and a logic operation result is used as a comparison result of the comparison unit.

11. The switching frequency synchronization circuit according to claim 4, wherein the switching control circuit comprises a selection circuit, the selection circuit receives the internal clock signal, the external clock signal and a comparison result of the comparison unit;

in a case that the comparison result indicates that the frequency of the external clock signal meets the requirement, the external clock signal is selected and output as the switching control signal; in a case that the comparison result indicates that the frequency of the external clock signal does not meet the requirement, the internal clock signal is selected and output as the switching control signal.

12. The switching frequency synchronization circuit according to claim 4, wherein at least some circuit structures of the first oscillator, the first voltage generating circuit, the comparison unit, and the switching control circuit are integrated in one or more chips.

13. The switching frequency synchronization circuit according to claim 1, wherein the comparison unit comprises a sample-and-hold circuit, the sample-and-hold circuit receives the first charging voltage signal and the second charging voltage signal to obtain peak values of the first charging voltage signal and the second charging voltage signal.

14. A switching power supply comprising a power stage circuit and a control circuit, wherein the control circuit comprises the switching frequency synchronization circuit according to of claim 1, and a switching control driving circuit, the switching frequency synchronization circuit is used for synchronizing a switching frequency of a switching transistor in the power stage circuit;

the switching control driving circuit is electrically coupled with the switching frequency synchronization circuit and is used for controlling on and off states of the switching transistor in the power stage circuit according to the internal clock signal output from the switching frequency synchronization circuit.

15. The switching power supply according to claim 14, wherein the control circuit comprises a ramp compensation circuit, the ramp compensation circuit receives the second charging voltage signal to obtain a ramp signal associated with a peak value of the second charging voltage signal;

the switching control driving circuit is electrically coupled with the ramp compensation circuit to control on and off states of the switching transistor in the power stage circuit according to the ramp signal.

16. The switching power supply according to claim 15, wherein the ramp compensation circuit comprises a ramp generating circuit and a first current circuit, the ramp generating circuit obtains a first ramp signal according to a first current source;

the first current circuit receives a peak signal of the second charging voltage signal to obtain a first current signal associated with the peak signal of the second charging voltage signal, which flow through a resistor to generate a second voltage signal;

the first ramp signal is superimposed with the second voltage signal to obtain the ramp signal.

17. The switching power supply according to claim 14, wherein the switching power supply comprises multi-phase power stage circuits, the control circuit comprises a frequency multiplier which obtains a third charging voltage signal according to a charging source and a charging capacitor, and obtains frequency-multiplied signals by comparing the third charging voltage signal and a second reference signal, wherein the frequency multiplier receives the second charging voltage signal, and adjusts a value of the second reference signal according to a falling edge of the second charging voltage signal and a falling edge of the last one of the frequency-multiplied signals.

18. The switching power supply according to claim 17, wherein the frequency multiplier controls the falling edge of the last one of the frequency-multiplied signals to coincide with the falling edge of the second charging voltage signal.

19. A method for synchronizing a switching frequency, comprising:

obtaining a first charging voltage signal in accordance with an external clock signal, obtaining a second charging voltage signal in accordance with an internal clock signal from a first oscillator for controlling a switching frequency;

obtaining and comparing peak values of the first charging voltage signal and the second charging voltage signal to determine whether the frequency of the external clock signal meets the requirement of a frequency range, so that the second charging voltage signal is reset by the external clock signal in a case that the requirement is met, to synchronize the frequency of the internal clock signal with the frequency of the external clock signal.

20. The method for synchronizing the switching frequency according to claim 19, wherein the frequency of the external clock signal is determined to meet the requirement of the frequency range when the peak value of the first charging voltage signal is within a range between −50% and +50% of the peak value of the second charging voltage signal.

21. The method for synchronizing the switching frequency according to claim 19, wherein the first charging voltage signal and the second charging voltage signal are both sawtooth signals, the method determines whether a time difference between a falling edge of the first charging voltage signal and a falling edge of the second charging voltage signal is within a predetermined time threshold range, and if so, the second charging voltage signal is reset by the external clock signal.

22. The method for synchronizing the switching frequency according to claim 21, wherein the method obtains the peak values of the second charging voltage signal and the first charging voltage signal, and compares the peak values of the second charging voltage signal and the first charging voltage signal to generate a first comparison result;

the method obtains falling edges of the second charging voltage signal and the first charging voltage signal, and compares a time difference between the falling edges of the second charging voltage signal and the first charging voltage signal with a predetermined time difference to generate a second comparison result;

in a case that both of the first comparison result and the second comparison result are valid, the second charging voltage signal is reset by the external clock signal.

* * * * *